United States Patent
Hamada et al.

(10) Patent No.: US 8,354,712 B2
(45) Date of Patent: Jan. 15, 2013

(54) SEMICONDUCTOR DEVICE AND METHOD OF MANUFACTURING THE SAME

(75) Inventors: Mitsuhiro Hamada, Niigata (JP); Katsuyoshi Jokyu, Niigata (JP)

(73) Assignee: Panasonic Corporation, Osaka (JP)

( * ) Notice: Subject to any disclaimer, the term of this patent is extended or adjusted under 35 U.S.C. 154(b) by 46 days.

(21) Appl. No.: 13/023,889

(22) Filed: Feb. 9, 2011

(65) Prior Publication Data
US 2011/0233663 A1    Sep. 29, 2011

(30) Foreign Application Priority Data
Mar. 25, 2010    (JP) .................................. 2010-069023

(51) Int. Cl.
*H01L 27/108*    (2006.01)
*H01L 29/76*    (2006.01)

(52) U.S. Cl. ........ 257/330; 257/331; 257/332; 257/341; 438/270

(58) Field of Classification Search .......... 257/330–332, 257/341, E29.257, E29.264, E21.41, E21.421; 438/270, 510
See application file for complete search history.

(56) References Cited

U.S. PATENT DOCUMENTS
5,891,807 A * 4/1999 Muller et al. ................. 438/713
2010/0200914 A1* 8/2010 Hamada ........................ 257/330

* cited by examiner

*Primary Examiner* — Theresa T Doan
(74) *Attorney, Agent, or Firm* — Hamre, Schumann, Mueller & Larson, P.C.

(57) ABSTRACT

A body contact layer 18 is formed on the side of a recessed structure 17 as well as in the bottom of the recessed structure 17, so that a contact area between the body contact layer 18 and a well layer 12 is increased and the amount of dopant implanted to the body contact layer 18 is suppressed.

4 Claims, 8 Drawing Sheets

SEMICONDUCTOR DEVICE AND METHOD OF MANUFACTURING THE SAME

FIELD OF THE INVENTION

The present invention relates to a semiconductor device and particularly relates to a high-voltage vertical MOSFET and a method of manufacturing the same.

BACKGROUND OF THE INVENTION

In vertical MOSFETs used for, e.g., switches of power sources, it has been requested to improve breakdown voltages while reducing on resistances. In a high-voltage vertical MOSFET according to the related art, the parasitic resistances of a body contact layer and a well layer are reduced by increasing the dopant concentrations of the body contact layer and the well layer and the potential of a channel region is stabilized, so that the breakdown voltage is improved.

Referring to FIG. 9, the following will describe the structure of the high-voltage vertical MOSFET according to the related art.

FIG. 9 is a sectional view of the structure of the high-voltage vertical MOSFET according to the related art, showing the structure of a pair of transistors.

As shown in FIG. 9, in the high-voltage vertical MOSFET according to the related art, an N-type drain layer 31 is formed on an N-type semiconductor substrate 30 by an epitaxial method and a P-type well layer 32 including a channel region is formed in contact with the drain layer 31 on the front side of the N-type semiconductor substrate 30. Further, multiple N-type source layers 33 are selectively formed on the well layer 32 on the front side of the N-type semiconductor substrate 30. On the source layers 33, trenches 35 are formed that are internally covered with gate insulating films 34 and reach the drain layer 31 from the well layer 32. Formed in the trenches 35 are gate electrodes 36. On the surface of the well layer 32 between the source layers 33, a recessed structure 37 is formed in contact with the two adjacent source layers 33. Further, a body contact layer 38 is formed immediately under the bottom of the recessed structure 37. Moreover, insulating films 39 are stacked over the gate electrodes 36. Furthermore, a source electrode 40 is formed on the source layers 33, the body contact layer 38, and the insulating films 39. When a voltage is applied to the source layer 33, the same voltage is applied to the body contact layer 38. On the back side of the semiconductor substrate 30, a drain electrode 41 is formed.

In such a semiconductor device, the body contact layer 38 is formed in the bottom of the recessed structure 37 by implanting a group IIIb dopant such as boron from the front side of the semiconductor substrate 30, reducing connection resistance between the source electrode 40 and the well layer 32. For example, the body contact layer 38 is formed with a dopant concentration of $5E20/cm^3$ by implanting $5E20/cm^3$ of boron.

In this configuration, the application of a bias voltage to the gate electrodes 36 electrically connects the source layers 33 and the drain layer 31. At this point in time, a source voltage is applied to the body contact layer 38, so that the potential of the well layer 32 serving as the channel region is stabilized and the breakdown voltage is improved.

DISCLOSURE OF THE INVENTION

In the semiconductor device and the method of manufacturing the same according to the related art, however, boron implanted for forming the body contact layer 38 is also implanted to the surfaces of the source layers 33. Thus in regions 42 implanted with boron on the source layers 33, connection resistance with the source electrode 40 disadvantageously increases and causes faulty connections between the source layers 33 and the source electrode 40. For example, $5E20/cm^3$ of boron is implanted to the N-type source layers 33 of $3E20/cm^3$, so that a P-type dopant concentration exceeds an N-type dopant concentration in the regions 42 on the surfaces of the source layers 33 and results in faulty connections with the source electrode 40.

In order to prevent the implantation of boron to the source layers 33, a mask may be formed on the source layers 33 during the formation of the body contact layer 38. However, the formation of a mask increases the number of steps of manufacturing the semiconductor device.

In order to solve the problem, a semiconductor device and a method of manufacturing the same according to the present invention have as its object to easily improve a breakdown voltage while suppressing faulty connections on a source electrode.

In order to attain the object, a semiconductor device of the present invention includes: a semiconductor substrate of a first conductivity type; a drain layer of the first conductivity type on the surface of the semiconductor substrate; a well layer of a second conductivity type on the surface of the drain layer; trenches formed at least in the well layer, the trench including a gate insulating film formed on the inner surface of the trench; gate electrodes formed in the respective trenches; source layers of the first conductivity type on the surface of the well layer, the source layer being in contact with the trench; a recessed structure formed in the surface region of the well layer so as to face the trench via the source layer; a body contact layer of the second conductivity type on the surface of the well layer, on the bottom and the side of the recessed structure; insulating films covering the respective gate electrodes; a source electrode formed over a surface containing the source layers and the body contact layer; and a drain electrode formed on the back side of the semiconductor substrate, wherein the well layer has a higher dopant concentration of the second conductivity type than the dopant concentration of the drain layer of the first conductivity type, and the source layer of the first conductivity type and the body contact layer of the second conductivity type have higher dopant concentrations than the dopant concentration of the second conductivity type of the well layer.

The semiconductor device may further include a tapered portion formed on the side of the recessed structure.

Preferably, the dopant concentration of the first conductivity type on the surface of the source layer is at least $1E19/cm^3$, the dopant concentration of the second conductivity type of the well layer is $1E15/cm^3$ to $5E17/cm^3$, and the dopant concentration of the second conductivity type of the body contact layer is at least $1E19/cm^3$.

Preferably, the body contact layer is formed continuously to a part of the side of the source layer.

A method of manufacturing a semiconductor device according to the present invention includes the steps of: forming a drain layer of a first conductivity type by epitaxial growth on the surface of a semiconductor substrate of the first conductivity type; forming a well layer of a second conductivity type by implanting a dopant of the second conductivity type at a first concentration to the surface of the drain layer; forming trenches in the well layer, the trench including a gate insulating film formed on the inner surface of the trench; forming gate electrodes in the respective trenches, the gate electrode being covered with an insulating film; forming source layers on the surface of the well layer by implanting a dopant of the first conductivity type at a second concentration in the surface direction of the semiconductor substrate; forming a recessed structure between the source layers; forming a body contact layer of the second conductivity type under the sides of the source layers and on the surface of the well layer exposed on the bottom and the side of the recessed structure, by implanting a dopant of the second conductivity type at a third concentration to the surface of the semiconductor substrate in the surface direction of the semiconductor substrate such that the dopant covers the upper regions of the source layers; forming a source electrode on the surfaces of the source layers and the bottom and the side of the recessed structure; and forming a drain electrode on the back side of the semiconductor substrate, wherein the first concentration is lower than the second concentration and the third concentration and the source layer has a surface concentration higher than the third concentration.

A method of manufacturing a semiconductor device according to the present invention includes the steps of: forming a drain layer of a first conductivity type by epitaxial growth on the surface of a semiconductor substrate of the first conductivity type; forming a well layer of a second conductivity type by implanting a dopant of the second conductivity type at a first concentration to the surface of the drain layer; forming trenches in the well layer, the trench including a gate insulating film formed on the inner surface of the trench; forming gate electrodes in the respective trenches, the gate electrode being covered with an insulating film; forming source layers on the surface of the well layer by implanting a dopant of the first conductivity type at a second concentration in the surface direction of the semiconductor substrate; forming a recessed structure between the source layers with a tapered portion formed on the side of the recessed structure; forming a body contact layer of the second conductivity type under the sides of the source layers and on the surface of the well layer exposed on the bottom and the side of the recessed structure, by implanting a dopant of the second conductivity type at a third concentration to the surface of the semiconductor substrate in the surface direction of the semiconductor substrate such that the dopant covers the upper regions of the source layers; forming a source electrode on the surfaces of the source layers and the bottom and the side of the recessed structure; and forming a drain electrode on the back side of the semiconductor substrate, wherein the first concentration is lower than the second concentration and the third concentration and the source layer has a surface concentration higher than the third concentration.

Preferably, the first concentration is at least $1E15/cm^3$, the second concentration is $1E17/cm^3$ to $5E21/cm^3$, and the third concentration is at least $1E19/cm^3$.

DESCRIPTION OF THE EMBODIMENTS

First Embodiment

Figure 1:
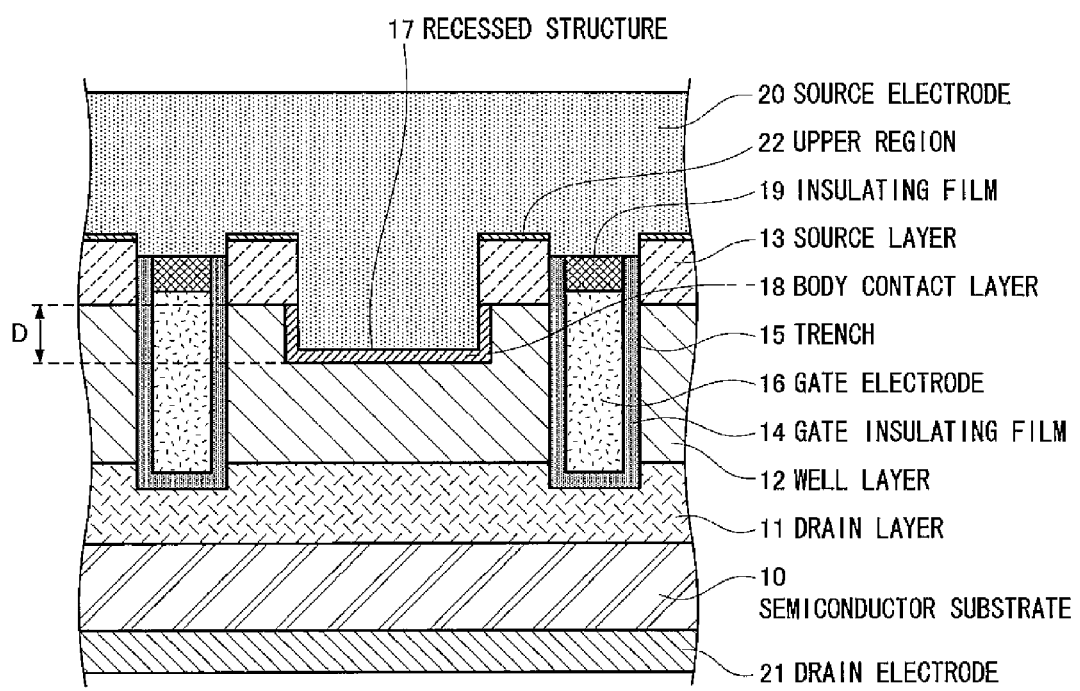
FIG. 1 is a sectional view showing the structure of a high-voltage vertical MOSFET according to a first embodiment.

Referring to FIG. 1, the following will describe a semiconductor device according to a first embodiment.

FIG. 1 is a sectional view showing the structure of a high-voltage vertical MOSFET according to the first embodiment.

As shown in FIG. 1, in the high-voltage vertical MOSFET according to the first embodiment, an N-type drain layer 11 is formed on an N-type semiconductor substrate 10 by, e.g., an epitaxial method and a P-type well layer 12 is formed on the surface of the drain layer 11. Further, the P-type well layer 12 has a region serving as a channel region on the front side of the N-type semiconductor substrate 10. Moreover, N-type source layers 13 are selectively formed on the well layer 12 on the front side of the N-type semiconductor substrate 10. Furthermore, trenches 15 are formed in contact with the source layers 13 so as to reach the drain layer 11 from the well layer 12, the inner surfaces of the trenches 15 are covered with gate insulating films 14, and gate electrodes 16 are formed in the trenches 15. On the surface of the well layer 12, a recessed structure 17 is formed in contact with the two adjacent source layers 13 such that the recessed structure 17 faces the trench 15 via the source layer 13. Further, a body contact layer 18 is formed on the bottom and side of the recessed structure 17 on the surface of the well layer 12. Moreover, insulating films 19 are stacked in the respective trenches 15 so as to cover the gate electrodes 16. Further, a source electrode 20 is formed on the exposed source layers 13, the exposed gate insulating films 14, the exposed body contact layer 18, and the exposed insulating films 19. A potential is applied to the source layer 13 and the same potential is applied to the body contact layer 18. Further, a drain electrode 21 is formed on the back side of the semiconductor substrate 10.

In this configuration, the application of a bias voltage to the gate electrodes 16 electrically connects the source layers 13 and the drain layer 11. At this point in time, a source voltage is also applied to the body contact layer 18, so that parasitic resistance caused by a potential difference in the well layer 12 is reduced, the charge of the well layer 12 serving as a channel region is stabilized, and the breakdown voltage is improved.

As has been discussed, the body contact layer 18 of the recessed structure 17 is formed by implanting a group IIIb dopant such as boron from the surface of the semiconductor substrate 10. A feature of the present invention is that the amount of dopant is smaller than in the related art and the body contact layer 18 having a higher dopant concentration than in the well layer 12 is formed not only in the bottom but also on the side of the recessed structure 17. As the amount of dopant decreases, the dopant concentration of the body contact layer 18 decreases and contact resistance increases in the bottom of the recessed structure 17. However, the body contact layer 18 is formed also on the side of the recessed structure 17, so that a contact area between the body contact layer 18 and the well layer 12 can be increased and parasitic resistance can be sufficiently reduced in the relationship between a contact area containing a side area and a dopant concentration. Simultaneously, the amount of dopant is reduced. Thus in an upper region 22 of the source layer 13, it is possible to suppress an increase in connection resistance between the source layer 13 and the source electrode 20. Further, it is not necessary to form a mask on the source layers 13 in a doping process for forming the body contact layer 18, thereby easily improving the breakdown voltage.

For example, boron is implanted as a dopant to the recessed structure 17 that has a diameter of 0.4 μm and has a portion with a depth D of 0.5 μm in contact with the well layer 12. In this case, the concentration of the implanted dopant is at least $1E19/cm^3$ and the body contact layer 18 has a dopant concentration of at least $1E19/cm^3$. Instead of setting the dopant concentration of the body contact layer 18 at a lower concentration than in the related art, the body contact layer 18 is formed also on the side of the recessed structure 17 to increase a contact area between the body contact layer 18 and the well layer 12. Thus it is possible to suppress the parasitic resistance of the well layer 12 to stabilize the potential, and improve the breakdown voltage. At the same time, the dopant concentration of the surface of the source layer 13, for example, a dopant concentration up to a depth of about 10 nm to 30 nm from the surface is higher than that of the body contact layer 18, thereby suppressing faulty connections between the source layers 13 and the source electrode 20. Specifically, as has been discussed, the body contact layer 18 is formed also on the side having a height D of 0.5 μm, so that the same effect of reducing parasitic resistance can be obtained by implanting a dopant at 1E19, unlike in the related art requiring the implantation of a dopant at 5E20.

Referring to FIGS. 2A to 2D, 3A to 3D, and 4A to 4C, the following will describe a method of manufacturing the semiconductor device according to the first embodiment.

FIGS. 2A to 2D, 3A to 3D, and 4A to 4C are process sectional views for explaining the method of manufacturing the semiconductor device according to the first embodiment.

Figure 2A:
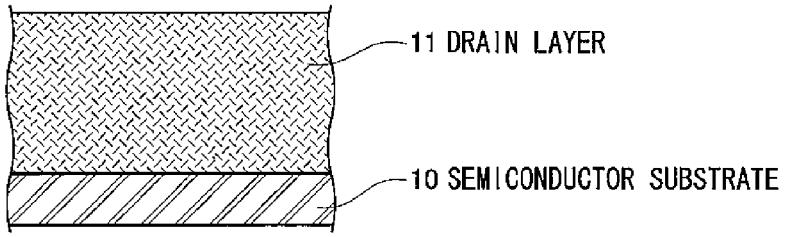
FIG. 2A is a process sectional view for explaining a method of manufacturing a semiconductor device according to the first embodiment.

First, the drain layer 11 is grown on the N-type semiconductor substrate 10 by the epitaxial method (FIG. 2A).

Figure 2B:
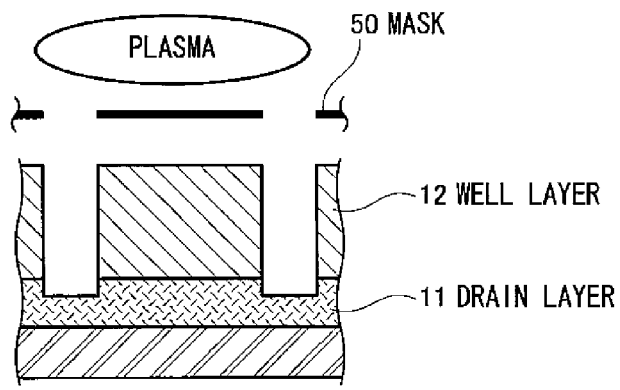
FIG. 2B is a process sectional view for explaining the method of manufacturing the semiconductor device according to the first embodiment.

Next, dopant ions are implanted over the drain layer 11, so that the P-type well layer 12 is formed on the front side of the semiconductor substrate 10. After that, the well layer 12 is selectively etched using a mask 50 having openings on the formation regions of the trenches 15. At this point in time, the upper part of the drain layer 11 is also partially etched such that the drain layer 11 has projecting portions (FIG. 2B).

Figure 2C:
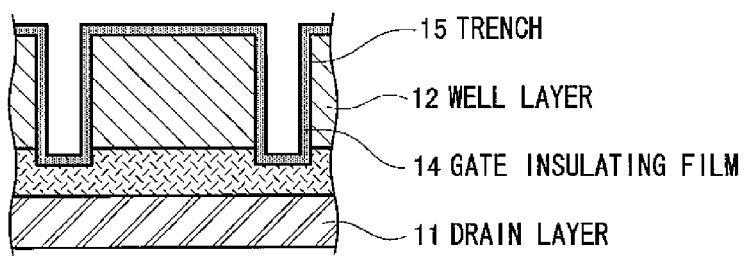
FIG. 2C is a process sectional view for explaining the method of manufacturing the semiconductor device according to the first embodiment.

Subsequently, an oxide film serving as a gate insulating film 14 is formed over the front side of the semiconductor substrate 10 by an oxide film growth method, so that the trenches 15 are formed (FIG. 2C).

Figure 2D:
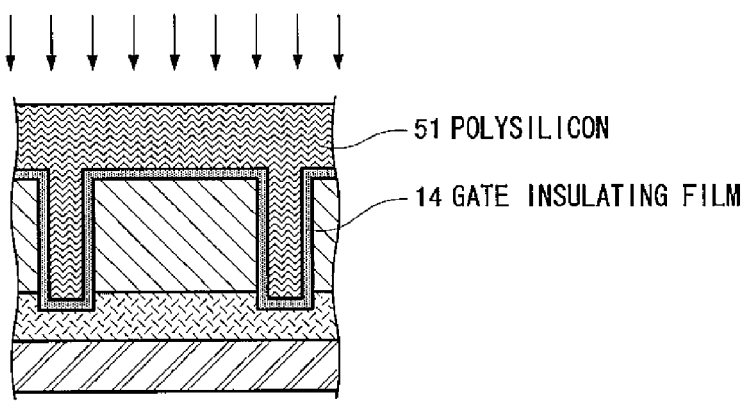
FIG. 2D is a process sectional view for explaining the method of manufacturing the semiconductor device according to the first embodiment.

After that, polysilicon 51 is grown over the oxide film and high-concentration N-type ions are implanted to reduce the resistance (FIG. 2D).

Figure 3A:
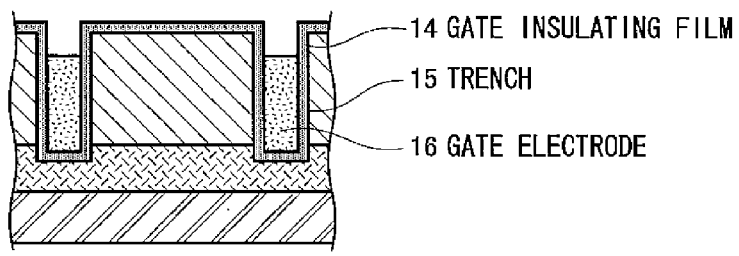
FIG. 3A is a process sectional view for explaining the method of manufacturing the semiconductor device according to the first embodiment.

Next, the polysilicon 51 is partially removed by etching, so that the gate electrodes 16 having a predetermined height are formed in the trenches 15 (FIG. 3A).

Figure 3B:
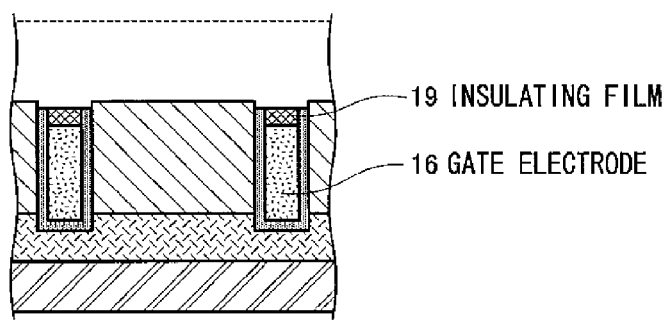
FIG. 3B is a process sectional view for explaining the method of manufacturing the semiconductor device according to the first embodiment.

Subsequently, an interlayer insulating film is stacked over the surface and then is partially removed by etching while the interlayer insulating films on the gate electrodes 16 are left as the insulating films 19. At this point in time, the oxide film on the well layer 12 is also removed (FIG. 3B).

Figure 3C:
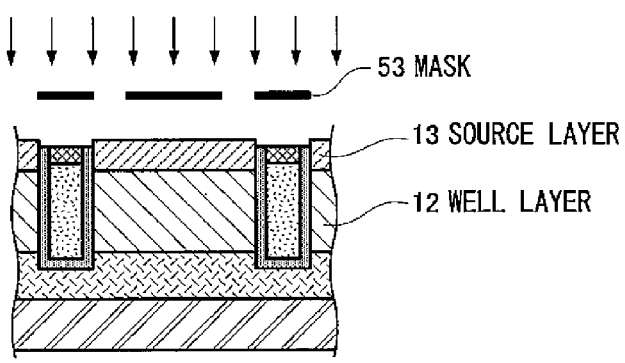
FIG. 3C is a process sectional view for explaining the method of manufacturing the semiconductor device according to the first embodiment.

Further, ions of $1E17/cm^3$ to $5E21/cm^3$ are implanted on the well layer 12 with a mask 53, so that the N-type source layers 13 are formed (FIG. 3C).

Figure 3D:
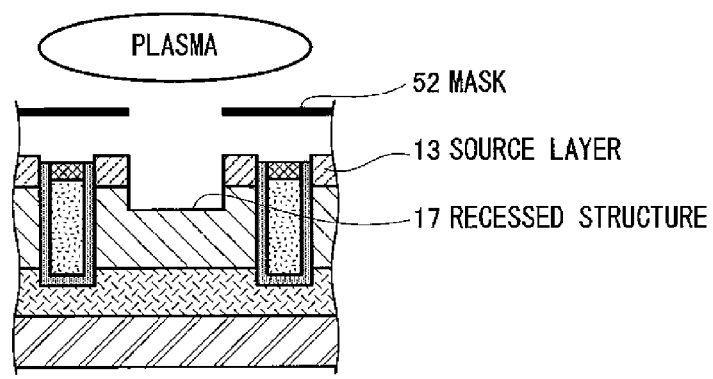
FIG. 3D is a process sectional view for explaining the method of manufacturing the semiconductor device according to the first embodiment.

Next, plasma etching is selectively performed on a part of the surface of the well layer 12 with a mask 52. Thus the recessed structure 17 with a depth D of 0.5 μm is formed in a part of the well layer 12 such that the recessed structure 17 is deeper than the source layer 13 in the etching region (FIG. 3D).

Figure 4A:
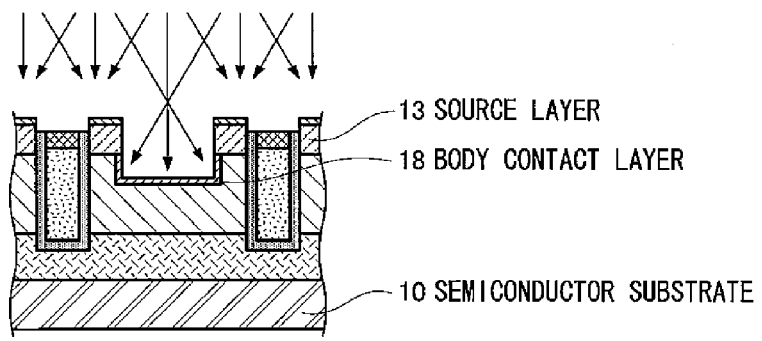
FIG. 4A is a process sectional view for explaining the method of manufacturing the semiconductor device according to the first embodiment.

Subsequently, dopant ions such as boron of at least $1E19/cm^3$ are implanted over the surface to form the body contact layer 18 on the surface of the recessed structure 17. At this point in time, the dopant ions are implanted not only perpendicularly to the surface of the semiconductor substrate 10 but also diagonally to the perpendicular direction, so that the body contact layer 18 is formed also on the side of the recessed structure 17. The dopant ions are implanted also on the source layer 13 because a mask is not used in the ion implantation. However, the amount of dopant is reduced and thus an increase in resistance is suppressed in the upper regions 22 on the surfaces of the source layers 13 (FIG. 4A).

Figure 4B:
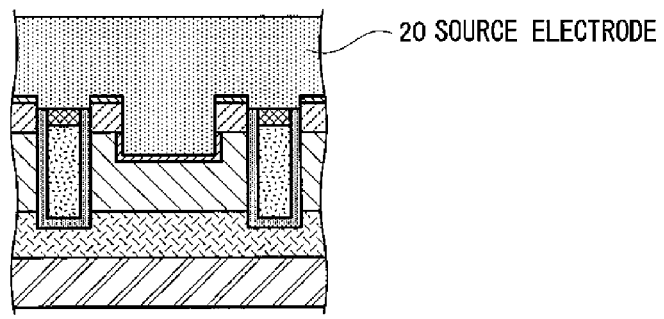
FIG. 4B is a process sectional view for explaining the method of manufacturing the semiconductor device according to the first embodiment.

Next, aluminum is sputtered over the surface, so that the source electrode 20 is formed that is electrically connected to the sides of the source layers 13 and the body contact layer 18 (FIG. 4B).

Figure 4C:
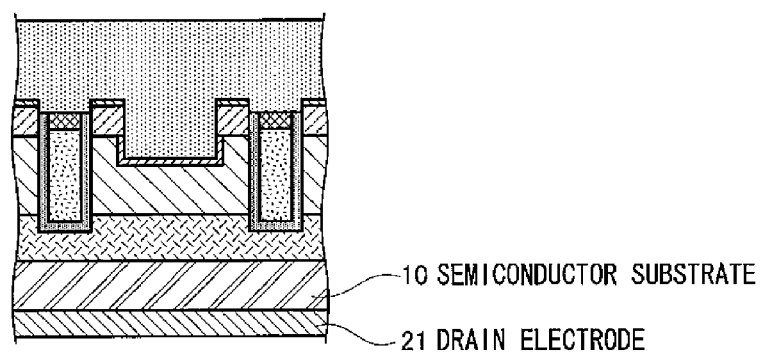
FIG. 4C is a process sectional view for explaining the method of manufacturing the semiconductor device according to the first embodiment.

Finally, the drain electrode 21 is formed on the back side of the semiconductor substrate 10, so that the semiconductor device illustrated in FIG. 1 is completed (FIG. 4C).

As has been discussed, the dopant is implanted not only in the vertical direction but also in diagonal directions to form the body contact layer 18, so that the body contact layer 18 is formed on the side of the recessed structure 17 in addition to the bottom of the recessed structure 17 and a sufficient contact area can be obtained between the body contact layer 18 and the well layer 12. Thus it is possible to suppress the amount of dopant. Since the amount of dopant can be suppressed, even the source layers 13 doped with the dopant do not increase the resistance of the upper regions 22 on the surfaces of the source layers 13, eliminating the need for a mask during dopant implantation for forming the body contact layer 18. For this reason, without increasing the number of steps, the body contact layer 18 can be formed with sufficiently low contact resistance and the breakdown voltage can be improved.

Figure 5:
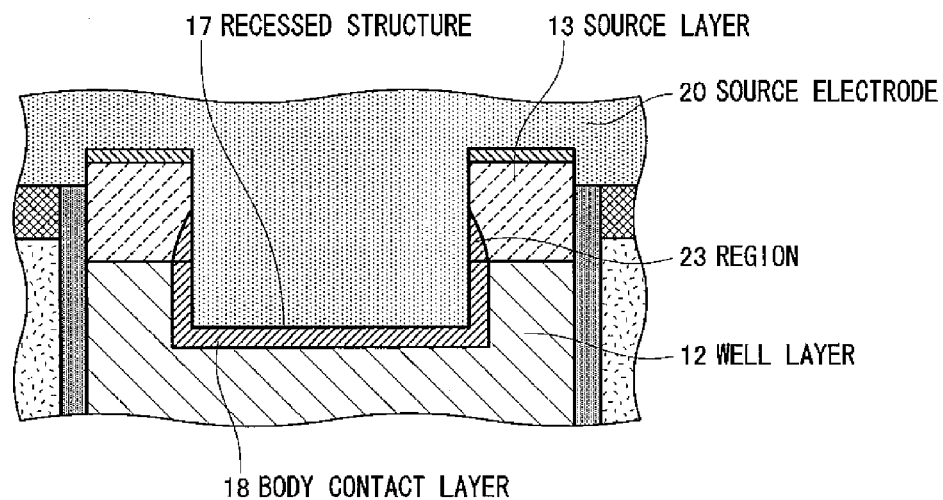
FIG. 5 is a sectional view showing the formation region of a body contact layer according to the first embodiment.
Figure 6:
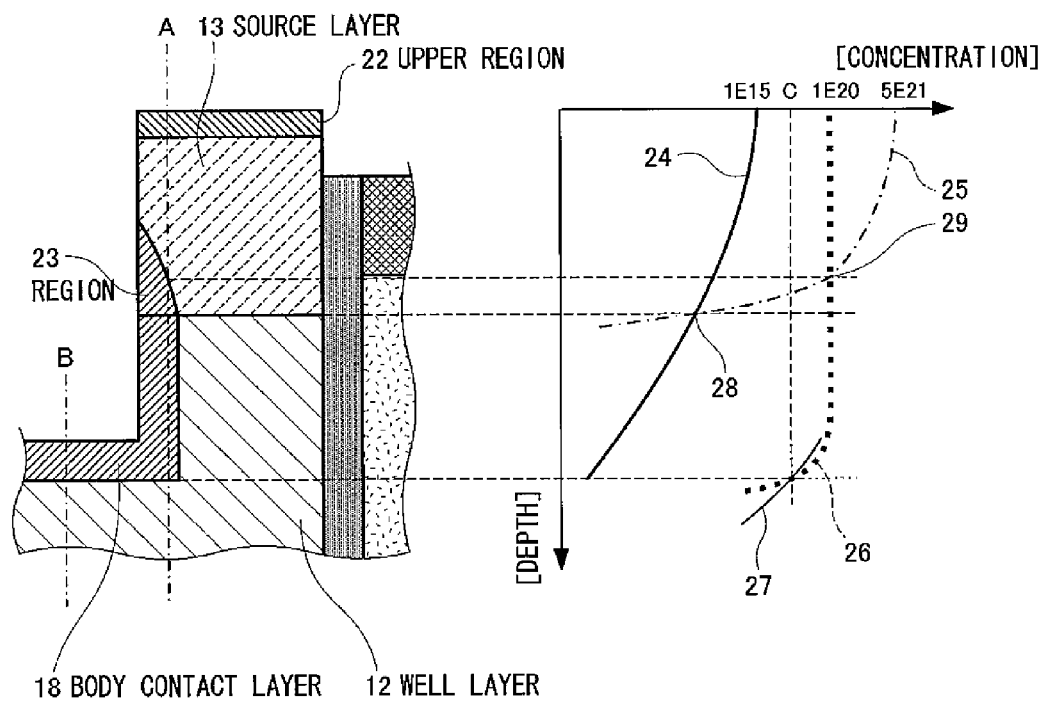
FIG. 6 shows dopant concentration profiles according to the first embodiment.

Referring to FIGS. 5 and 6, the following will specifically describe the body contact layer and a dopant concentration around the body contact layer.

FIG. 5 is a sectional view showing the formation region of the body contact layer according to the first embodiment. FIG. 6 shows dopant concentration profiles according to the first embodiment.

As shown in FIG. 5, the body contact layer 18 of the present invention is formed by implanting a P-type dopant on the bottom and side of the recessed structure 17 in which the P-type well layer 12 is exposed. A region doped with at least a certain concentration of the P-type dopant acts as the body contact layer 18 that is a contact electrode between the source electrode 20 and the well layer 12. Since the source layer 13 is an N-type semiconductor layer, the P-type dopant implanted without using a mask is also implanted to the surface and exposed sides of the source layer 13, thereby reducing a difference between the N-type dopant concentration and the P-type dopant concentration of the source layer 13. The source layer 13 is formed by implanting an N-type dopant and thus the N-type dopant concentration increases with a distance from the well layer 12 adjacent to the implanting surface. Thus in the upper region 22 having a high N-type dopant concentration in the source layer 13, a relatively high N-type dopant concentration is obtained as compared with a P-type dopant concentration. In contrast to the upper region 22, on the side of the source layer 13, the N-type dopant concentration decreases as approaching the recessed structure 17, and the P-type dopant concentration becomes more dominant as approaching the recessed structure 17. Further, a region where the P-type dopant concentration is dominant decreases with a distance from the recessed structure 17 (region 23).

FIG. 6 shows the concentration profiles of the respective dopants at A. The well layer 12 is formed by implanting the P-type dopant from the front side of the semiconductor substrate 10 (see FIG. 1) and the source layers 13 are formed by implanting the N-type dopant. Reference numeral 24 denotes the concentration profile of the P-type dopant and reference numeral 25 denotes the concentration profile of the N-type dopant. A part above the depth of the intersection (intersection 28) of 24 and 25 represents the source layer 13 dominantly implanted with the N-type dopant, and a part under the intersection 28 represents the well layer 12 dominantly implanted with the P-type dopant. Reference numeral 26 denotes the concentration profile of the P-type dopant implanted at A to form the body contact layer 18. Since the P-type dopant is implanted vertically and diagonally, the concentration profile is substantially kept constant. Reference numeral 27 denotes the concentration profile of the P-type dopant implanted at B for forming the body contact layer 18.

In the well layer 12, the body contact layer 18 is a region containing at least a certain concentration of the P-type dopant, e.g., a region in which a concentration C of FIG. 6 is at least $1E19/cm^3$. Reference numeral 23 denotes the region where the P-type dopant is dominant over the N-type dopant in the source layer 13. In other words, the region 23 is deeper than the depth of the intersection (intersection 29) of the concentration profile 26 of the P-type dopant and the concentration profile 25 of the N-type dopant. In the upper region 22, the amount of implanted P-type dopant is sufficiently smaller than the concentration of the N-type dopant and thus the N-type dopant is dominant over the P-type dopant. Therefore, an ohmic connection is sufficiently obtained between the source electrode 20 and the source layer 13 without implanting the P-type dopant with a mask.

As has been discussed, the body contact layer 18 having a lower dopant concentration than the source layer 13 is formed on the bottom and side of the recessed structure 17. Thus the parasitic resistance of the well layer 12 can be reduced without adding a mask forming process, thereby easily improving the breakdown voltage.

Second Embodiment

Referring to FIGS. 7 and 8A to 8C, the following will describe a semiconductor device and a method of manufacturing the same according to a second embodiment.

Figure 7:
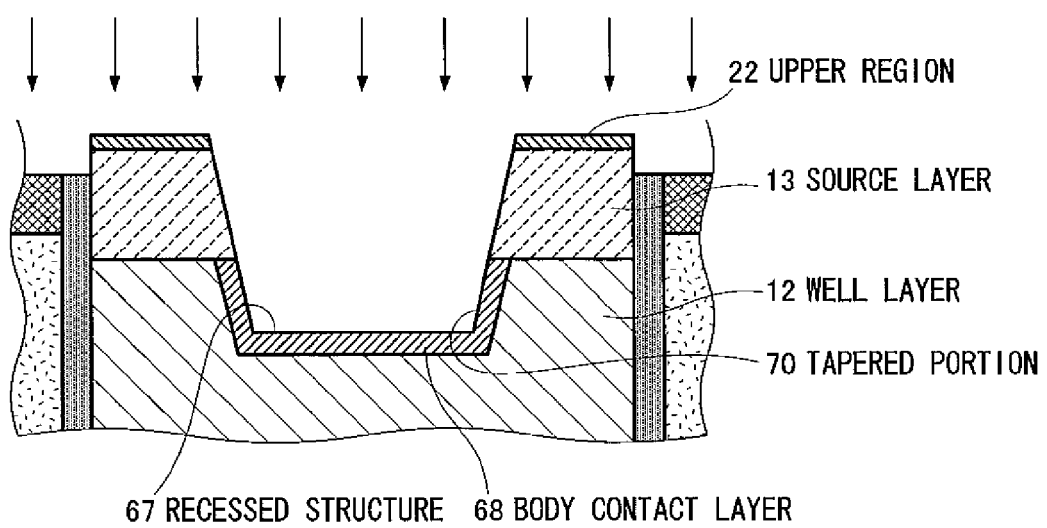
FIG. 7 is a sectional view showing the structure of a high-voltage vertical MOSFET according to a second embodiment.
Figure 8A:
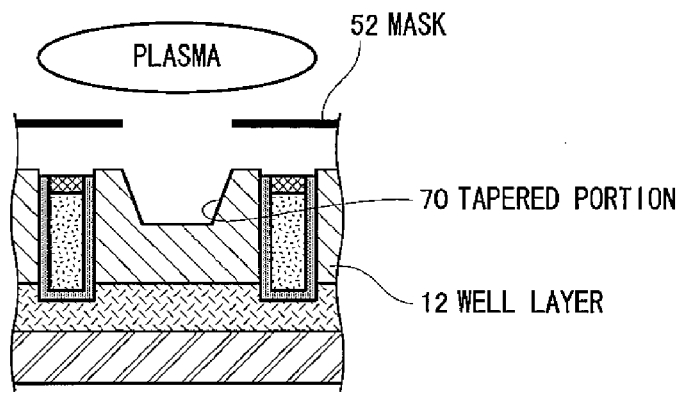
FIG. 8A is a process sectional view for explaining a method of manufacturing a semiconductor device according to the second embodiment.
Figure 8B:
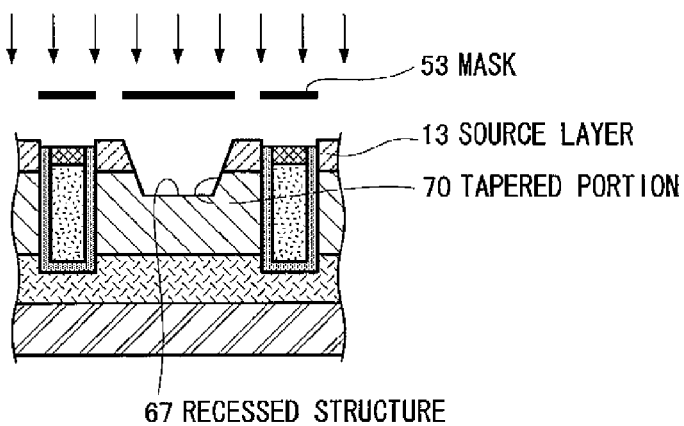
FIG. 8B is a process sectional view for explaining the method of manufacturing the semiconductor device according to the second embodiment.
Figure 8C:
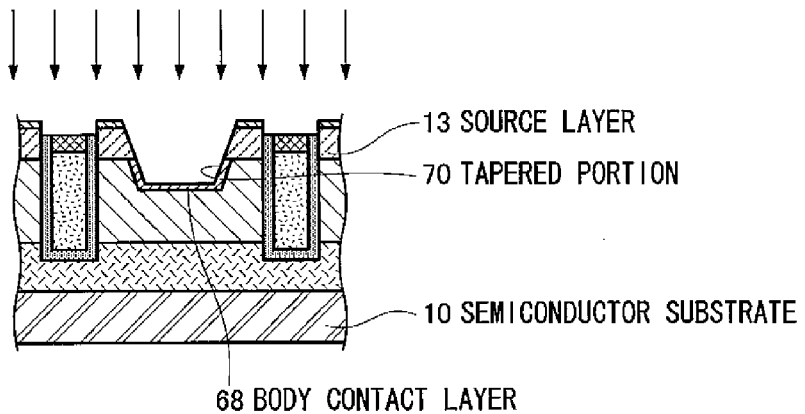
FIG. 8C is a process sectional view for explaining the method of manufacturing the semiconductor device according to the second embodiment.
Figure 9:
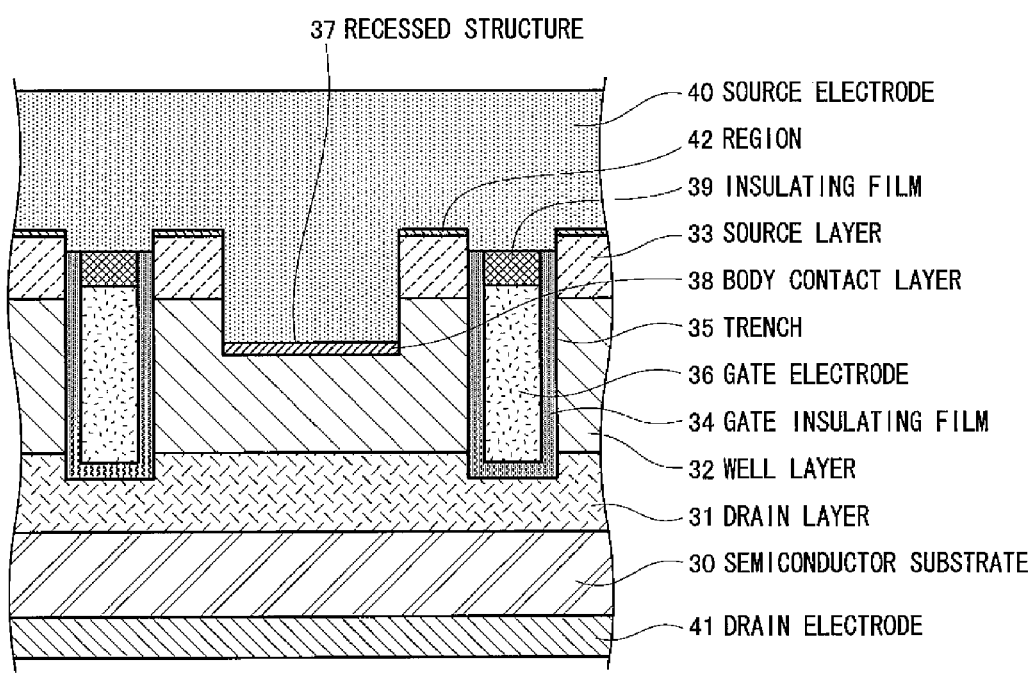
FIG. 9 is a sectional view showing the structure of a high-voltage vertical MOSFET according to the related art.

FIG. 7 is a sectional view showing the structure of a high-voltage vertical MOSFET according to the second embodiment. The same configurations as FIG. 1 are indicated by the same reference numerals and the explanation thereof is omitted. FIGS. 8A to 8C are process sectional views for explaining the method of manufacturing the semiconductor device according to the second embodiment.

The semiconductor device and the method of manufacturing the same according to the second embodiment are different from those of the first embodiment as follows: the side of a recessed structure 67 has an inwardly tapered portion 70 that tapers down toward the bottom of the recessed structure 67 and a dopant is not implanted diagonally but only in the vertical direction during the formation of a body contact layer 68.

As shown in FIG. 7, the inwardly tapered portion 70 is formed on the side of the recessed structure 67. Thus even when a dopant is implanted only in the vertical direction, the body contact layer 68 can be formed on the bottom and the side of the recessed structure 67. It is therefore possible to obtain, as in the first embodiment, a contact area between the body contact layer 68 and a well layer 12 and reduce the parasitic resistance of the well layer 12 to improve the breakdown voltage. Since the contact area can be sufficiently obtained, the amount of dopant can be reduced and an ohmic connection can be obtained between an upper region 22 of the source layer 13 and a source electrode 20 (see FIG. 1) without using a mask.

In the example of FIG. 7, the tapered portion 70 is continuously formed from source layers 13 to the recessed structure 67. The tapered portion 70 may be formed only on the side of the recessed structure 67 while the sides of the source layer 13 are vertically formed.

In the method of manufacturing the semiconductor device, the steps up to FIG. 3B are similar to those of the first embodiment and thus the explanation thereof is omitted. After the step of FIG. 3B, as shown in FIG. 8A, plasma etching is selectively performed on a part of the surface of the well layer 12 with a mask 52. At this point in time, the tapered portion 70 is formed on the sides of an etching region by adjusting the mask 52 during the plasma etching. Further, the other part of the top of the well layer 12 is ion implanted with a mask 53 to form the N-type source layer 13. Thus in the etching region, the well layer 12 has the recessed structure 67 including the tapered portion 70 such that the recessed structure 67 is deeper than the source layers 13 (FIG. 8B). As in the first embodiment, the recessed structure 67 having the tapered portion 70 on the side of the recessed structure 67 may be formed after the formation of the source layers 13.

Next, dopant ions such as boron of at least $1E19/cm^3$ are implanted over the surface to form the body contact layer 68 on the surface of the recessed structure 67. At this point in time, unlike in the first embodiment, the dopant ions are implanted only perpendicularly to the surface of a semiconductor substrate 10 but the body contact layer 68 can be formed also on the side of the recessed structure 67 because the tapered portion 70 is provided on the recessed structure 67. The dopant ions are implanted without using a mask and thus are implanted also on the source layers 13. However, the amount of dopant is reduced, so that an increase in resistance is suppressed in the upper regions 22 on the surfaces of the source layers 13 (FIG. 8C).

The subsequent steps are similar to those of the first embodiment and thus the explanation thereof is omitted.

As has been discussed, the tapered portion is provided on the recessed structure 67 that is the formation region of the body contact layer 68. Thus even when a dopant is implanted only in the vertical direction, the body contact layer 68 is formed on the side of the recessed structure 67 as well as in the bottom of the recessed structure 67 and a sufficient contact area can be obtained between the body contact layer 68 and the well layer 12, thereby suppressing the amount of dopant. Since the amount of dopant can be suppressed, even a dopant implanted in the source layer 13 does not increase the resistance of the upper region 22 on the surface of the source layer 13 and a mask is not necessary when the dopant is implanted to form the body contact layer 68. Thus it is possible to form the body contact layer 68 having sufficiently low contact resistance without increasing the number of steps and improve the breakdown voltage.

In the case where a pair of high-voltage vertical MOSFETs is continuously formed according to the foregoing embodiments, the gate electrode wiring, the source electrode wiring, and the drain electrode wiring of the respective vertical MOSFETs are connected in common, forming a switching device for a power supply and so on.

In this case, trenches having gate electrodes are preferably formed in parallel to stabilize the characteristics.

In the foregoing embodiments, the vertical N-channel transistors are formed on the N-type semiconductor substrate. By changing dopants, P-channel vertical transistors can be formed in the same configuration. In addition, insulated-gate bipolar transistors (IGBTs) can be formed in the same configuration.

What is claimed is:

1. A semiconductor device comprising:
   a semiconductor substrate of a first conductivity type;
   a drain layer of the first conductivity type on a surface of the semiconductor substrate;
   a well layer of a second conductivity type on a surface of the drain layer;
   trenches formed at least in the well layer, the trench including a gate insulating film formed on an inner surface of the trench;
   gate electrodes formed in the respective trenches;
   source layers of the first conductivity type on a surface of the well layer, the source layer being in contact with the trench;
   a recessed structure formed in a surface region of the well layer so as to face the trench via the source layer;
   a body contact layer of the second conductivity type on the surface of the well layer, on a bottom and a side of the recessed structure;
   insulating films covering the respective gate electrodes;
   a source electrode formed over a surface containing the source layers and the body contact layer; and
   a drain electrode formed on a back side of the semiconductor substrate,
   wherein the well layer has a higher dopant concentration of the second conductivity type than a dopant concentration of the drain layer of the first conductivity type, and the source layer of the first conductivity type and the body contact layer of the second conductivity type have higher dopant concentrations than the dopant concentration of the second conductivity type of the well layer.

2. The semiconductor device according to claim 1, further comprising a tapered portion formed on the side of the recessed structure.

3. The semiconductor device according to claim 1, wherein the dopant concentration of the first conductivity type on a surface of the source layer is at least $1E19/cm^3$, the dopant concentration of the second conductivity type of the well layer is $1E15/cm^3$ to $5E17/cm^3$, and the dopant concentration of the second conductivity type of the body contact layer is at least $1E19/cm^3$.

4. The semiconductor device according to claim 1, wherein the body contact layer is formed continuously to a part of a side of the source layer.

* * * * *